United States Patent [19]

Baldwin et al.

[11] 4,125,933

[45] Nov. 21, 1978

[54] IGFET INTEGRATED CIRCUIT MEMORY CELL

[75] Inventors: Steven M. Baldwin, San Diego; Donald L. Henderson, Sr., Encinitas; Joel A. Karp, Palo Alto, all of Calif.

[73] Assignee: Burroughs Corporation, Detroit, Mich.

[21] Appl. No.: 792,578

[22] Filed: May 2, 1977

Related U.S. Application Data

[62] Division of Ser. No. 703,524, Jul. 8, 1976.

[51] Int. Cl.² ............................................. B01J 17/00
[52] U.S. Cl. .................................. 29/571; 29/577 C; 29/578; 29/25.42; 357/23; 357/51
[58] Field of Search ............... 29/571, 577, 578, 25.42

[56] References Cited

U.S. PATENT DOCUMENTS

| | | | |
|---|---|---|---|
| 3,698,077 | 10/1972 | Dahlberg | 29/578 |
| 3,740,731 | 6/1973 | Ohwada | 340/173 CA |
| 3,740,732 | 6/1973 | Frandon | 357/14 |
| 3,787,962 | 1/1974 | Yoshida | 29/578 |

Primary Examiner—W. Tupman
Attorney, Agent, or Firm—Mervyn L. Young; Kevin R. Peterson

[57] ABSTRACT

An IGFET integrated circuit memory cell structure utilizing a capacitor with increased charge storage capability, and a method making the same. The capacitor includes a high impurity concentration region having the same conductivity type as the substrate. An island of opposite conductivity type is inset in the region and a conductive field plate overlies the island. The structure also includes a transfer transistor in which the source region is adjacent the capacitor and overlaps the island region therein. Activation of the transistor serves to transfer the charge stored in the capacitor to the drain region where it can be read by external circuitry. In the method, the high concentration region and island in the capacitor are formed by successive ion implantation steps. A subsequent source and drain diffusion causes lateral migration of the conductive portions of the cell to increase the storage capacitance and to insure electrical contact between the island region of the capacitor and the source of the transfer transistor.

10 Claims, 8 Drawing Figures

IGFET INTEGRATED CIRCUIT MEMORY CELL

This is a division of application Ser. No. 703,524, filed July 8, 1976.

BACKGROUND OF THE INVENTION

This invention relates to semiconductor devices. More particularly, it relates to an IGFET integrated circuit structure for use as a memory cell which includes a capacitor and a transfer device.

Data information storage systems utilizing insulating gate field effect transistor (IGFET) circuits as storage elements have become increasingly popular due to the inherent advantages of the IGFET structure. IGFET circuits have been advantageously utilized in single transistor dynamic memory cells. An example of such memory cells may be had by reference to U.S. Pat. No. 3,740,732 Frandon and U.S. Pat. No. 3,852,800 Ohwada et al. Generally, these and other known memory cells utilize the inherent source capacitance of the transistor to store the charge representing the data. Unfortunately, the charge storage capabilities of these cells are limited which, in turn, limits the performance and density of the cell. Efforts have been made to increase the storage capacitance of these cells, but they have often been at the expense of other device characteristics on the integrated circuit chip or have required additional and/or nonstandard processing steps.

Object and Summary of the Invention

Therefore, it is the primary object of this invention to provide an IGFET memory cell with increased storage capacitance which can be made in accordance with the method of this invention that utilizes a minimum of relatively straight forward processing steps.

Briefly, this and other objects of the invention are provided by an integrated circuit structure including a capacitor and a transfer transistor. The capacitor includes a region of high concentration having the same conductivity type as the substrate. The region wholly surrounds an island of opposite conductivity type inset in the substrate surface. A conductive field plate overlies the island region of the capacitor and is insulated from the substrate by a thin insulating layer. A gate region for the transfer transistor similarly overlies portions of the substrate between the source and the drain regions of the transfer transistor. The source region of the transfer transistor is adjacent to the capacitor and overlaps portions of the island of the capacitor. Charge is stored in the capacitor through the transfer transistor. The region of high conductivity provides an increased capacitance for the transistor by decreasing the depletion region of the PN junction developed between the island and the high concentration region. The charge stored in the capacitor can be transferred out through the drain region of the transistor upon applying an appropriate potential to the gate region of the transistor. Consequently, the charge stored in the capacitor can be read out of the drain region of the transistor. In the method of this invention, the high concentration region and island region of the capacitor are formed by successive ion implantation steps. The field plate and gate region are then defined on the substrate surface and are employed as masks for a subsequent source and drain diffusion. During the source and drain diffusion, the island region of the capacitor and the source of the transfer transistor are linked by lateral diffusion of the source impurity. Similarly, the high concentration region of the capacitor laterally diffuses to wholly surround the island region to further enhance the capacitance.

DESCRIPTION OF THE PREFERRED EMBODIMENT

Figure 1:
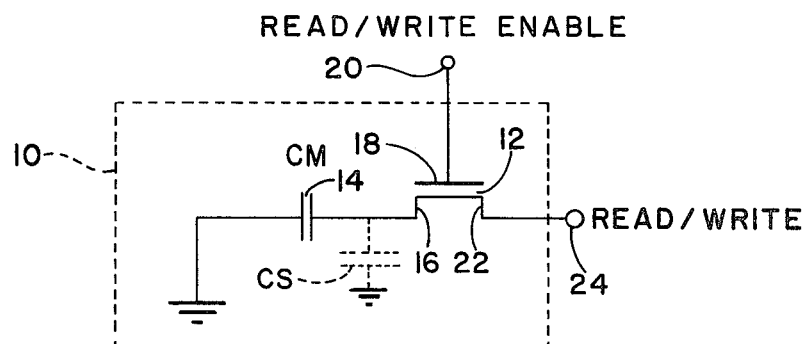
FIG. 1 shows a schematic view of a memory system utilizing the integrated circuit structure of this invention.

Reference to FIG. 1 shows a random access memory system utilizing the integrated circuit structure of this invention. The integrated circuit structure of the present invention is employed as a single transistor memory cell 10 including a transfer transistor 12 and a memory capacitor 14. Transfer transistor 12 includes an inherent source capacitance between the source region 16 and the substrate. This capacitance has been employed in the memory cells of the prior art to provide the charge storing capability for the cell. While this capacitance, labeled as $C_s$ in FIG. 1, is present in the integrated circuit structure of this invention, it is only used in cooperation with the separate memory capacitor 14 which stores the majority of charge for the cell.

Charge is stored in capacitor 14 by applying a turn on voltage to the gate 18 of the transistor 12 via READ/WRITE ENABLE line 20 to form a conductive channel between the source 16 and drain 22. A suitable voltage level, representing a data bit, at READ/WRITE line 24 is thus transferred through transistor 12 to capacitor 14. The voltage on READ/WRITE ENABLE line 20 is then removed to render transistor 12 nonconductive and thereby hold the stored charge in the capacitor 14. When the data, represented by the stored charge in capacitor 14, is desired to be read out, READ/WRITE ENABLE line 20 again supplies a potential to the transistor 12 to turn it on. The charged state of capacitor 14 is then transferred back through transistor 12 where it can be read by a data sense amplifier (not shown) coupled to READ/WRITE line 24. The unique structure and method of making the memory cell 10 provides an increased capacitance for capacitor 14. Consequently, the area required for the active devices can be effectively reduced and performance is increased.

Figure 2:
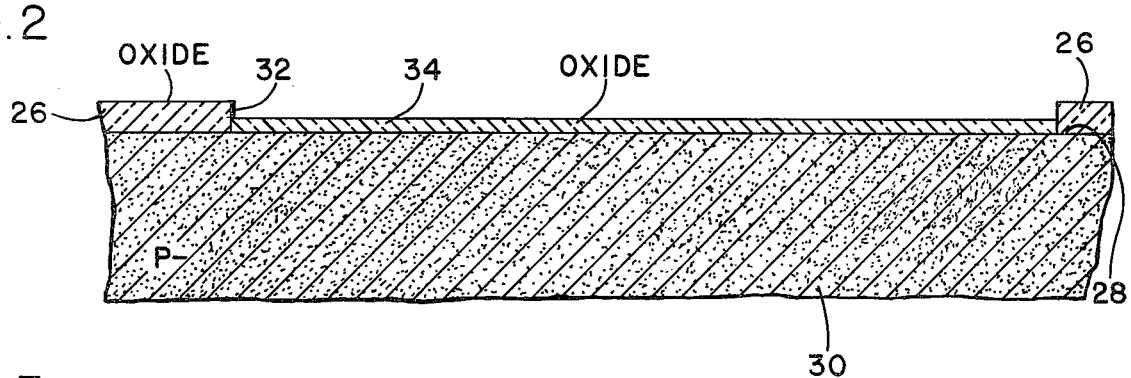
FIGS. 2-8 show successive steps during the method of making the integrated circuit structure in accordance with one embodiment of the method of the present invention.

FIGS. 2 through 8 illustrate the method of making the memory cell 10. Referring now to FIG. 2, a first oxide layer 26 approximately 1 micron thick is grown on the top surface 28 of substrate 30. Substrate 30, preferably silicon, is of a P-type conductivity with a relatively high resistivity and is consequently labeled "P−". Preferably, substrate 30 has an impurity concentration of $10^{14}$–$10^{15}$ impurity atoms per cubic centimeter. The advantage of using a high resistivity substrate is that unwanted parasitic junction capacitances in the devices formed in the substrate are reduced. The oxide layer 26 can be grown or deposited using techniques know in the art. As one example, it can be thermally grown in a steam vapor at 950° C. for a period of 600 minutes under atmospheric pressure. After oxide layer 26 is formed, a window 32 is cut in the oxide layer 26 in the areas where active devices are to be formed. This is accomplished using standard photolithographic techniques whereby a photoresist serves as a mask for a subsequent etching step wherein the oxide is removed in the areas of window 32. The use of photolithography and oxide etching are well known in the art and form no part of this invention. Consequently, they will not be described in detail. After window 32 is cut in oxide layer 26, a second thin oxide layer approximately 0.1 micron thick is grown on substrate surface 28 in the areas defined by window 32. The thin oxide layer 34 will serve as the dielectric for the capacitor and transfer transistor to be formed in substrate 30. Consequently, the thickness of oxide layer 34 can be varied according to desired device parameters. Preferably, however, thin oxide layer 34 is about 0.08–0.12 microns thick.

Figure 3:
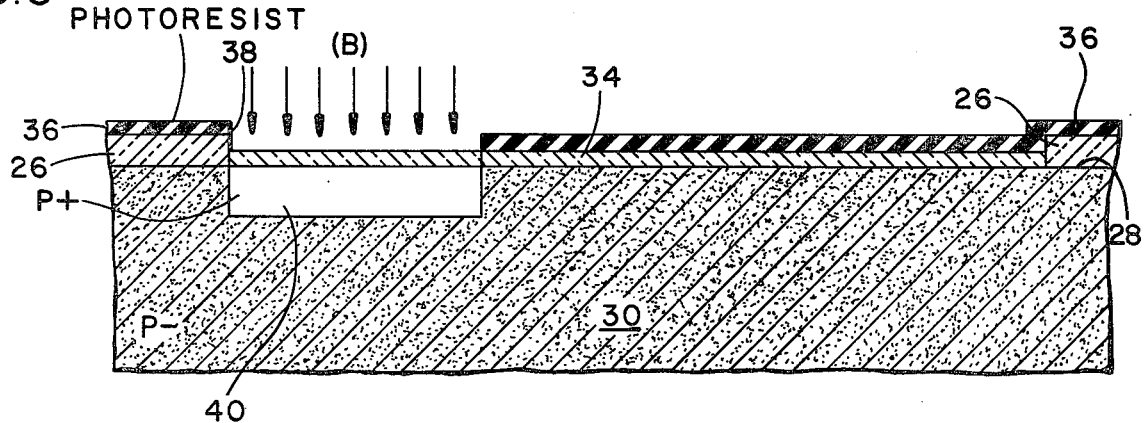

Referring now to FIG. 3, a photoresistor layer 36 is formed on the entire upper surface of the substrate covering oxide layers 26 and 34. The thickness of the photoresist should be sufficient to serve as a mask during the subsequent ion implantation step. Preferably, the thickness of photoresist layer 36 is approximately 0.5 to 2.0 microns thick. Using standard photolithographic techniques, a window 38 is cut into photoresist layer 36 in the areas defining the capacitor. After window 38 is formed, region 40 is formed in substrate surface by ion implantation. Acceptor ions are implanted approximately 1.0–2.0 microns deep into substrate surface 28. In this example, the projected range of the acceptor ions is 1.4 microns deep. The concentration of acceptor ions should be in the range of about $10^{17}$–$10^{18}$ impurity atoms per cubic centimeter. In this example, it has a concentration of about $2.5 \times 10^{17}$ atoms/cm$^3$. A preferred dopant is boron ions, however, other acceptor ions can be used such as aluminum. The region 40 thus formed has an increased impurity concentration compared to that of substrate 30. Consequently, region 40 is labeled as "P+". The P+ region 40 should have an impurity concentration of at least approximately 200 times that of substrate 30. In this preferred embodiment, substrate 30 has an impurity concentration of $10^{15}$ atoms/cm$^3$, while P+ region 40 has an impurity concentration of $2.5 \times 10^{17}$ atoms/cm$^3$. The basic ion implantation steps are well known in the art. In this embodiment, boron ions are accelerated with a potential between 350 and 500 Kev.

Figure 4:
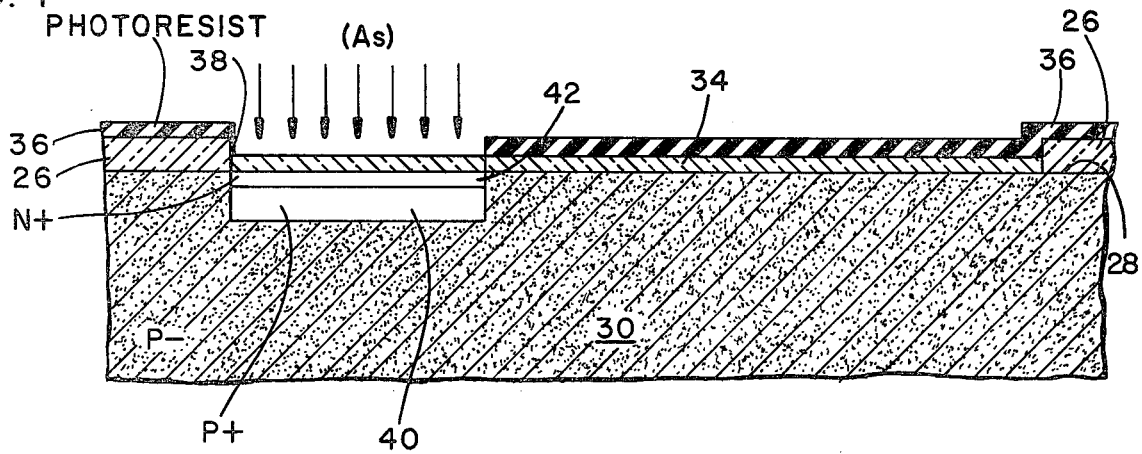

Referring now to FIG. 4, a second ion implantation step is performed to achieve island region 42. It should be noted that no new masks are needed as the original photoresist mask 36 will serve as a mask in this second successive ion implantation step. Island 42 is of an opposite conductivity type than region 40. Region 42 has a preferable impurity concentration of approximately $1 \times 10^{18}$–$5 \times 10^{18}$ impurity atoms per cubic centimeter. A preferred dopant is arsenic ions. However, phosphorous ions can also be used. It is important to note that island 42 does not extend into substrate 30 as deep as region 40. N+ region 42 is preferably approximately 0.01–0.05 microns thick. In this example, it is about 0.03 microns thick. In this example, N+ region 42 was formed by accelerating arsenic ions at a potential of 180 Kev.

Figure 5:
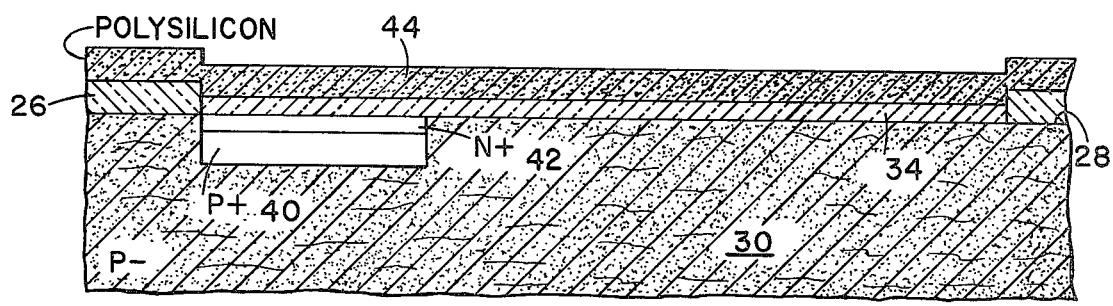

Referring now to FIG. 5, the photoresist layer 36 is removed using a suitable solvent. Then, a polycrystalline-silicon or polysilicon layer 44 is grown on the entire upper surface of the substrate 30 covering oxide layers 26 and 34. The polysilicon layer 44 will serve as the field plate and gate for the capacitor and transfer transistor, respectively. Consequently, the thickness of polysilicon layer 44 must be chosen to serve these purposes. In this example, polysilicon layer 44 is approximately 0.3–0.5 microns thick. Polysilicon layer 44 is formed, in this embodiment, by thermal decomposition of silane at about 900° at atmospheric pressure, utilizing a hydrogen carrier gas.

Figure 6:
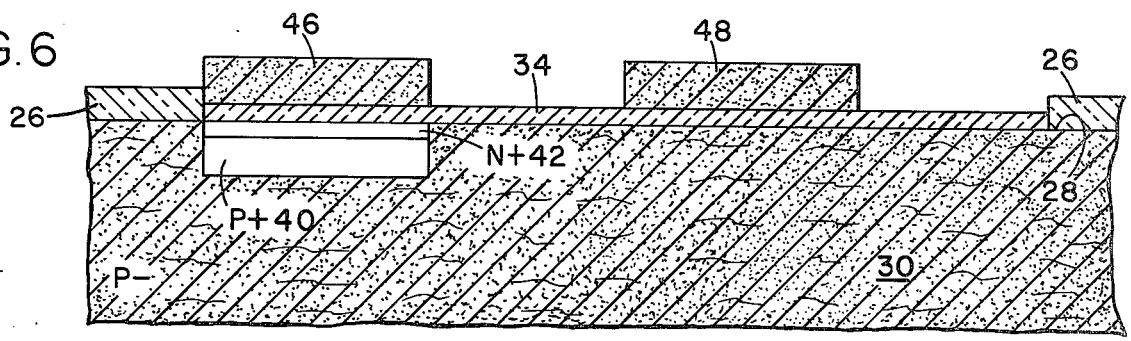

Turning now to FIG. 6, polysilicon layer 44 is defined in the usual manner by a patterned oxide maskant layer (not shown) and a suitable etchant such as potassium hydroxide which will not significantly attack the oxide layers. The polysilicon layer 44 is thus removed in all areas except for those areas defining field plate 46 for the capacitor and gate 48 for the transistor as shown in FIG. 6.

Figure 7:
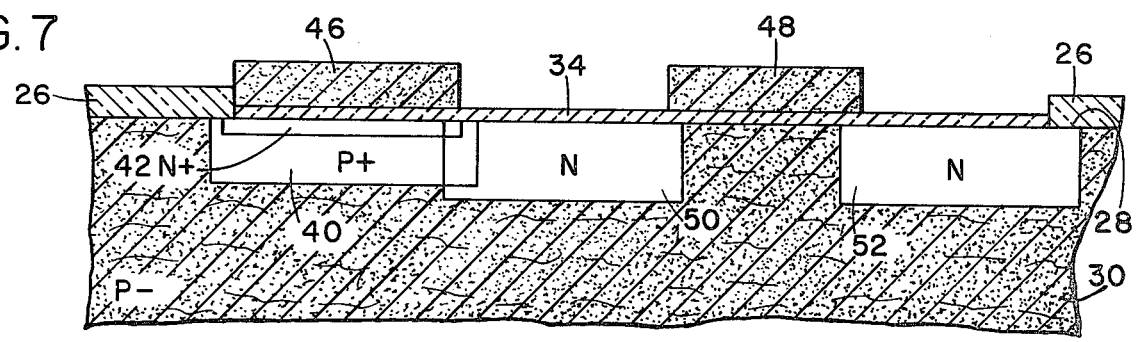

After field plate 46 and gate region 48 are formed, the substrate 30 is subjected to a diffusion to form source region 50 and drain region 52 for the transfer transistor as can be seen in FIG. 7. The substrate is placed in a diffusion furnace containing phosphorous oxychloride gas at a temperature of about 950° C. for a period of 45 minutes under about one atmosphere of pressure. While a preferred dopant is phosphorous, other N-type or donor dopants for source 50 and drain region 52, such as arsenic can be also employed. The source and drain region have an impurity concentration of approximately $10^{19}$–$10^{20}$ atoms/cm$^3$. Field plate 46 and gate 48 are rendered conductive by this diffusion step and consequently serve as electrical conductors.

It is important to note that the source 50 and drain 52 regions diffuse laterally as well as vertically during the heat of this diffusion process. N+ island 42 and P+ region 40 of the capacitor also diffuse laterally during this diffusion process. Consequently, as can be seen in FIG. 7, portions of the source 50 overlap the N+ island 42. This insures that good electrical contact is provided between the island 42 of the capacitor and the source 50 of the transistor. Since the impurity concentration of the source 50 is much greater than the P+ region 40, the conductivity of the source 50 is not greatly affected by the acceptor impurities of the P+ region 40. Another feature of this invention is that the P+ region 40 diffuses laterally to a greater extent than the N+ region 42. Consequently, P+ region 40 wholly surrounds lower portions of N+ region. This is because the diffusion coefficient of the P-type impurities have a higher diffusion coefficient than the N-type impurities in island 42. Consequently, the area of the PN junction formed between N+ island 42 and P+ region 40 is maximized which, in turn, increases the storage capacitance capability of the capacitor. Furthermore, the depletion region of the PN junction is kept to a minimum since the PN junction is formed between two highly concentrated regions, namely, N+ island 42 and P+ region 40. If the island region 42 was formed directly into the high resistivity substrate 30, the PN junction thus formed would have a greater depletion region thereby lowering the capacitance of the capacitor. In contrast, the PN junction depletion region is minimized by this invention to increase the storage capability per unit area of the capacitor.

Figure 8:
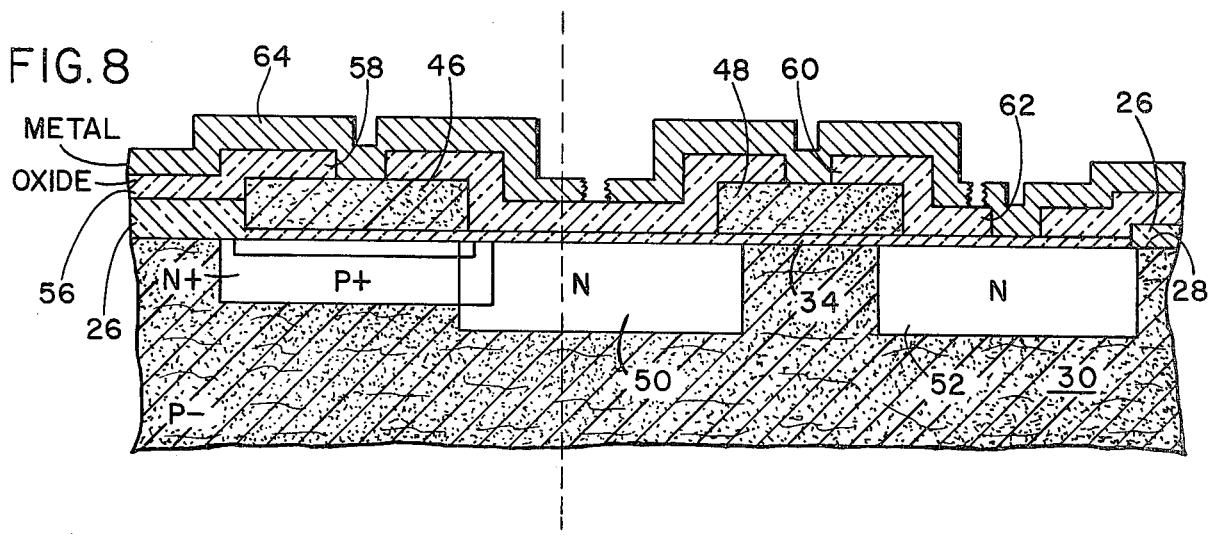

Attention is now drawn to FIG. 8 in which the electrical connections are made to the various devices. An oxide layer 56 is next formed over the upper surface of the substrate 30 as by vapor deposition techniques. The thickness of oxide layer 56 should be such as to provide electrical insulation between the underlying active regions and an overlying metalization layer as is well known in the art. Windows 58, 60, and 62 are etched into oxide layer 56 to expose the field plate 46, gate 48, and drain 52 regions, respectively. A layer of metalization 64 is then deposited over the upper surface of the substrate and makes electrical connection to the field plate 46, gate 48, and drain 52 through their respective openings in oxide layer 56. In this embodiment, an aluminum layer is evaporated onto the substrate. It is then defined by standard photoresist and etching operations to form separate conductors for the field plate 46 for the capacitor 12, as well as the gate 48 and drain 52 of transfer transistor 12. It should be understood, that the connections to the various regions can be varied as desired.

The memory cell shown in FIG. 8 shows one embodiment of the integrated circuit structure of this invention. As denoted by the dotted line, the structure includes a capacitor 14 and a transfer transistor 12. During the operation of this memory cell, as described in connection with FIG. 1, charge will be entered into the capacitor 14 through transfer transistor 12. The charge will be thus stored in capacitor 14 until such time when it will be read through the drain 52 of the transistor 12. The total capacitance of capacitor 14 is the combination of the charge stored between the field plate 46 and the substrate 30 (commonly referred to as the oxide capacitance) and that of the PN junction between island 42 and region 40 (commonly referred to as the depletion region capacitance). The depletion region capacitance is a function of the width of the depletion region of the PN junction. Through the use of the P+ region 42 which has a higher concentration than the substrate 30, the width of the depletion region is minimized to thereby increase the depletion region capacitance. It would be undesirable for the entire substrate 30 to be of such high concentration because the PN junction capacitances of every diffused region in the integrated circuit structure would be increased to such an extent as to render the circuit inoperable.

When the charge in capacitor 14 is to be read, an appropriate potential is applied to the gate 48 of transfer transistor 12. The potential at gate 48 induces a channel between the source 50 and drain 52 region of the transistor. Thus, the charge in capacitor 14 is transferred through transistor 12 and can be read from the drain region 52. The total amount of charge that is read from drain region 52 includes both the capacitance of capacitor 14 as well as the inherent capacitance $C_s$ of source region 50. This inherent capacitance has been utilized by prior art memory cells to store the charge. In contrast, the present invention uses a separate capacitor device in combination with the inherent source capacitance to provide an increased storage capability for the memory cell.

In view of the above description of this invention, it can now be understood that this invention provides an IGFET memory cell having increased storage capabilities which can be made utilizing relatively straight forward individual processing steps which are uniquely combined by the method of this invention to permit the manufacturer to build the device with familiar equipment. Therefore, while this invention has been described in connection with a particular example thereof, no limitation is intended thereby except as defined by the appended claims.

We claim:

1. A method of making an enhanced semiconductor capacitor comprising the steps of:
forming an insulating layer on a major surface of a semiconductor substrate, said substrate being of one conductivity type with a given impurity concentration;
applying a maskant layer on the insulating layer;
opening a window in the maskant layer;
implanting impurity ions of said one conductivity type in said substrate surface through said window to form a region having the same conductivity type as said substrate yet having a greater impurity concentration than said substrate;
implanting impurity ions of the opposite conductivity type and at a lower energy level than said ions of one said conductivity type into said region through the same window to form an island of opposite conductivity type within said region;
removing said maskant layer; and
forming a conductive field plate on said insulating layer and overlying said island;
said region of said one conductivity type serving to increase the capacitance of the inversion layer associated with said island when a voltage is applied to said conductive field plate.

2. The method of claim 1 wherein the impurities of said region have a higher diffusion coefficient than the impurities of said island.

3. The method of claim 2 which further comprises the step of heating the substrate so that the impurities of said region diffuse laterally to wholly surround the lower portions of said island.

4. The method of claim 3 wherein the substrate and region have a P-type conductivity and wherein the island is of N-type conductivity.

5. The method of claim 4 wherein the impurity ions for said region are boron ions and wherein the impurity ions for said island are arsenic ions.

6. The method of claim 5 wherein the boron ions are implanted at a higher energy level than that at which the arsenic ions are implanted.

7. A method of making a memory cell having an enhanced capacitor and a transfer transistor comprising the steps of:
forming an insulating layer on the surface of a semiconductor substrate of one conductivity type with a given impurity concentration;
forming a maskant layer over said insulating layer;
opening a window in said maskant layer in regions wherein the capacitor is desired to be formed;
implanting ions of said one conductivity type into said substrate surface through said window thereby forming a region in said substrate having a greater impurity concentration than the substrate;
implanting through said same window impurity ions of the opposite conductivity type and at a lower energy than said ions of said one conductivity type to form an island within said region thereby forming a PN junction therebetween;
removing the maskant layer;
forming a second mask on said insulating layer having openings defining source and drain regions for a transfer transistor, with said source region opening being adjacent said island;
diffusing impurity ions of said opposite conductivity type into said substrate surface to form said source and drain regions for the transfer transistor, the impurity ions of said source and island regions mutually laterally migrating so that said island and source region overlap to form a conductive connection therebetween, said region having a greater impurity concentration similarly laterally migrating to wholly surround lower portions of said island;

forming a field plate on said insulating layer and overlying said island; and forming a gate region on said insulating layer and overlying portions of said substrate between said source and drain regions;

said region having a greater impurity concentration than said substrate serving to increase the capacitance of the inversion layer associated with said island when a voltage is applied to said field plate.

8. The method of claim 7 wherein the impurities of said capacitor region have a higher diffusion coefficient than the impurities of said island.

9. A method of making an enhanced memory cell including a capacitor and transfer transistor comprising the steps:

forming an oxide layer on the major surface of a P-type substrate having a given concentration;

depositing a photoresist layer on said oxide layer;

opening a window in said photoresist layer to define an area where the capacitor is to be formed;

implanting boron ions through said window into said substrate surface to form a region having a greater impurity concentration than said substrate;

implanting arsenic ions at a lower energy level than said boron ions through said same window into said region thereby forming an N-type island therein;

removing said photoresist layer;

depositing a polycrystalline silicon layer over the oxide layer;

removing portions of said polycrystalline silicon layer to define a field plate overlying said N-type island and a gate region for an adjacent transfer transistor; and heating said substrate in a gaseous atmosphere of N-type impurities to diffuse said N-type impurites into said substrate surface to form source and drain regions for said transistor, said island region of said capacitor and the source region of the transistor laterally migrating and overlapping to provide a conductive connection therebetween, the impurities of said P+ region similarly laterally migrating during the heat of said diffusion to wholly surround lower portions of said island to thereby increase the capacitance of the inversion layer associated with said island when a voltage is applied to said field plate.

10. The method of claim 9 wherein boron ions are implanted at about 500 Kev to form said region and wherein arsenic ions are implanted at about 180 Kev to form said island.

* * * * *